(12) United States Patent  (10) Patent No.: US 7,705,457 B2
Han (45) Date of Patent: Apr. 27, 2010

(54) WAFER LEVEL SEMICONDUCTOR PACKAGE AND METHOD FOR MANUFACTURING THE SAME

(75) Inventor: Kwon Whan Han, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 91 days.

(21) Appl. No.: 11/965,087

(22) Filed: Dec. 27, 2007

(65) Prior Publication Data

US 2009/0140424 A1 Jun. 4, 2009

(30) Foreign Application Priority Data

Nov. 30, 2007 (KR) ...................... 10-2007-0123755

(51) Int. Cl.
*H01L 23/52* (2006.01)
*H01L 21/44* (2006.01)
(52) U.S. Cl. ............... 257/738; 257/734; 257/E21.476; 257/E23.141
(58) Field of Classification Search ................ 257/734, 257/678–733, 784–796, E23.001–E23.194
See application file for complete search history.

(56) References Cited

U.S. PATENT DOCUMENTS

2007/0252257 A1* 11/2007 Baek et al. ................. 257/678

2008/0014735 A1* 1/2008 Chung et al. ................. 438/597

FOREIGN PATENT DOCUMENTS

KR 10-0583966 B1 5/2006
KR 1020060100885 A 9/2006

* cited by examiner

*Primary Examiner*—Fernando L Toledo
*Assistant Examiner*—Mamadou Diallo
(74) *Attorney, Agent, or Firm*—Ladas & Parry LLP

(57) ABSTRACT

A wafer level semiconductor package includes a semiconductor chip having a circuit part. A bonding pad group is disposed in the semiconductor chip and included in the bonding pad group is a power pad that is electrically connected to the circuit part. An internal circuit pattern is disposed at a side of the bonding pad group. An additional power pad is disposed at a side of the bonding pad group, and the additional power pad is electrically connected to the circuit part. An insulation layer pattern is disposed over the semiconductor chip, and the insulation layer includes openings that expose the power pad, the internal circuit pattern, and the additional power pad. A redistribution is disposed over the insulation layer pattern, and the redistribution is electrically connected to at least two of the power pad, the internal circuit pattern, and the additional power pad.

18 Claims, 4 Drawing Sheets

WAFER LEVEL SEMICONDUCTOR PACKAGE AND METHOD FOR MANUFACTURING THE SAME

CROSS-REFERENCE TO RELATED APPLICATIONS

The present application claims priority to Korean patent application number 10-2007-0123755 filed on Nov. 30, 2007, which is incorporated herein by reference in its entirety.

BACKGROUND OF THE INVENTION

The present invention relates generally to a wafer level semiconductor package and a method for manufacturing the same.

Recent developments have lead to semiconductor chips with a high integration density of data and fast data processing speed. These semiconductor chips must find a way to prevent the generation of heat caused when the semiconductor chip with the high integration density of data and the fast data processing speed operates, as the heat causes a lowering in the performance of the semiconductor chip. In order to prevent the generation of heat, most recently developed semiconductor chips are required to have a low voltage operation characteristic.

In order to satisfy the low voltage operation characteristic of the semiconductor chip, the semiconductor chip requires a larger number of power supplying pads. However, semiconductor chips have a limited area, making it difficult to form the larger number of power supplying pads. In addition, the size of the semiconductor chip increases when a larger number of power supplying pads is formed in the semiconductor chip.

Additionally, internal wiring of the semiconductor chip is used to provide power to a specific portion of the semiconductor chip, e.g. an edge portion of the semiconductor chip. In this case, a problem occurs, in that sufficient power cannot be provided to the edge portion of the semiconductor chip through the internal wiring of the semiconductor chip.

SUMMARY OF THE INVENTION

Embodiments of the present invention are directed to a wafer level semiconductor package which can sufficiently provide the power required by a semiconductor chip.

Further, embodiments of the present invention are directed to a method for manufacturing the wafer level semiconductor package.

In one embodiment, a wafer level semiconductor package comprises a semiconductor chip having a circuit part; a bonding pad group disposed in the semiconductor chip and including a power pad electrically connected with the circuit part, wherein the power pad provides power to the semiconductor chip; an internal circuit pattern disposed in the semiconductor chip at a position excluding the position occupied by the bonding pad group; an additional power pad disposed in the semiconductor chip at a position excluding the position occupied by the bonding pad group and electrically connected with the circuit part; an insulation layer pattern disposed over the semiconductor chip, wherein the insulation layer has openings exposing the power pad, the internal circuit pattern, and the additional power pad; and a redistribution disposed over the insulation layer pattern and electrically connected to at least two of the power pad, the internal circuit pattern and the additional power pad through the openings.

The number of the power pad, the internal circuit pattern and the additional power pad is respectively at least two.

The bonding pad group is aligned and disposed in a center portion of the semiconductor chip and the internal circuit patterns and the additional power pads are respectively disposed at both sides of the bonding pad group.

The redistribution may be electrically connected to the power pad and the internal circuit pattern.

Also, the redistribution may be electrically connected to the power pad and the additional power pad.

Further, the redistribution may be electrically connected to the additional power pad and the internal circuit pattern.

Furthermore, the redistribution may be electrically connected to the power pad, the additional power pad, and the internal circuit pattern.

The redistribution includes a ball land pattern and a solder ball attached to the ball land pattern.

The wafer level semiconductor package further comprises a protective layer interposed between the semiconductor chip and the insulation layer, the protective layer includes openings for exposing the bonding pad group, the internal circuit pattern, and the additional power pad.

A capping layer pattern having an opening for exposing a portion of the redistribution is disposed over the semiconductor chip, a ball land pattern is disposed over the capping layer pattern and electrically connected with the redistribution through the opening, and a solder ball is attached to the ball land pattern.

The redistribution includes at least one of a gold (Au), copper, nickel and gold (Cu/Ni/Au) layer; a copper and gold (Cu/Au) layer; and nickel and gold (Ni/Au) layer.

In another embodiment, method for manufacturing a wafer level semiconductor package comprises the steps of manufacturing a semiconductor chip including a bonding pad group having a power pad electrically connected to a first position of a circuit part, an internal circuit pattern disposed at a position excluding the position occupied by the bonding pad group, an additional power pad disposed at a position excluding the position occupied by the bonding pad group and electrically connected to a second position of the circuit part; forming an insulation layer over the semiconductor chip, the semiconductor chip having openings for exposing the additional power pad, the internal circuit pattern, and the bonding pad group; and forming a redistribution over the insulation layer for electrically connecting at least two of the power pad, the internal circuit pattern and the additional power pad.

A protective layer pattern having an opening exposing the bonding pad group is provided over the semiconductor chip, and the protective layer pattern is patterned to expose the internal circuit pattern and the additional power pad.

The additional power pad is disposed at both sides of the bonding pad group.

The step of forming the redistribution includes the step of forming a ball land pattern disposed over the insulation layer and connected to the redistribution.

The method may further comprise, after the step of forming the redistribution, the steps of forming a capping layer covering the redistribution and having an opening for exposing a portion of the redistribution; and forming a ball land pattern disposed over the capping layer and electrically connected to the redistribution.

DESCRIPTION OF SPECIFIC EMBODIMENTS

Figure 1:
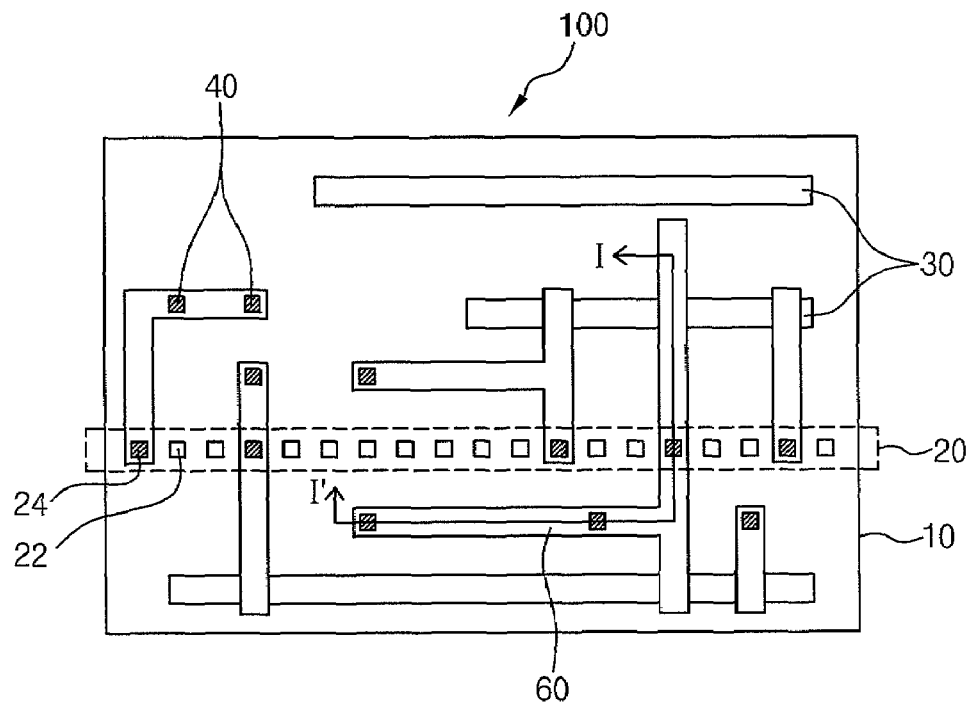
FIG. 1 is a plan view showing a wafer level semiconductor package in accordance with an embodiment of the present invention.
Figure 2:
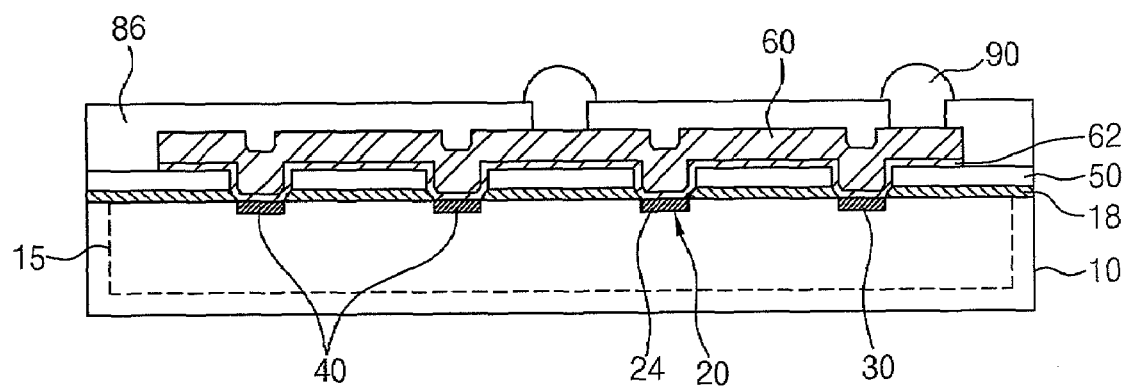
FIG. 2 is a sectional view taken along line I-I' in FIG. 1.

FIG. 1 is a plan view showing a wafer level semiconductor package in accordance with an embodiment of the present invention. FIG. 2 is a sectional view taken along line I-I' in FIG. 1.

Referring to FIGS. 1 and 2, a wafer level semiconductor package 100 includes a semiconductor chip 10, a bonding pad group 20, an internal circuit pattern 30, an additional power pad 40, an insulation layer pattern 50, and a redistribution 60.

The semiconductor chip 10 has, for example, a rectangular parallelepiped shape. The semiconductor chip 10 with a rectangular parallelepiped shape has an upper surface and a lower surface opposite the upper surface.

The semiconductor chip 10 includes a circuit part 15 and a protective layer pattern 18 as shown in FIG. 2.

The circuit part 15 includes a data storage part (not shown) including a transistor and a capacitor for storing data, and a peripheral part (not shown) for processing the data in the data storage part.

The protective layer pattern 18 protects the semiconductor chip 10 from external impact and vibration. The protective layer pattern 18 may be an oxide layer and/or a nitride layer. An opening in the protective layer pattern 18 exposes the bonding pad group 20, the internal circuit pattern 30, and the additional power pad 40 (which will be described in later) to the outside.

The bonding pad group 20 includes a data pad 22 through which an address signal, a data signal, and a control signal is input or output; and a power pad 24 to which power for operating the semiconductor chip 10 is applied. In the present embodiment, the bonding pad group 20 may include a plurality of data pads 22 and a plurality of power pads 24.

The power pad 24 included in the bonding pad group 20 uses internal wiring (not shown) inside the semiconductor chip 10 to provide power to the circuit part 15 shown in FIG. 2. The internal wiring (which is electrically connected with the power pad 24 included in the bonding pad group 20) is manufactured using a thin film processing process, and thus the internal wiring has a relatively high electric resistance.

The internal circuit pattern 30 may be disposed on one of either side or both sides of the bonding pad group 20. For example, at least one internal circuit pattern 30 may be disposed in the body of the semiconductor chip 10.

The internal circuit pattern 30 is electrically connected to the circuit part 15 inside of the body of the semiconductor chip 10, and the internal circuit pattern 30 has a relatively low electric resistance when compared to the internal circuit that is connected to the power pad 24 included in the bonding pad group 20.

The internal circuit pattern 30 (having the relatively low electric resistance) is electrically connected to the redistribution 60 (which will be described later), and can provide sufficient power without having to increase the number of the power pads 24 included in the bonding pad group 20.

Although sufficient power is provided to the circuit part 15 through the internal circuit pattern 30, the power provided to a specific portion, e.g. an edge portion of the semiconductor chip 10, may be insufficient in a case where there is enhanced integration density of data and a data processing speed in the semiconductor chip 10.

Of course, it is possible to provide the power sufficiently by increasing the number of the internal circuit patterns 30 or by increasing the length of the internal circuit pattern 30. However, in an aspect of a design, there is a specific portion of the semiconductor chip 10 where it is difficult to form the internal circuit pattern 30, making it difficult to sufficiently provide power to the specific portion of the semiconductor chip 10 using only the internal circuit pattern 30.

The additional power pad 40 can provide sufficient power to the specific portion of the semiconductor chip 10 to which power cannot be provided sufficiently by only the internal circuit pattern 30.

The additional power pad 40 may be disposed at one of either side or both sides of the bonding pad group 20. For example, at least one additional power pad 40 may be disposed in the body of the semiconductor chip 10.

A predetermined number of the additional power pads 40 may be formed at predetermined positions of the body of the semiconductor chip 10 (excluding the position of the bonding pad group 20). In other words, the additional power pad 40 may be freely formed at the portions where it is difficult to form the internal circuit pattern 30, and thus can provide sufficient power to the circuit part 15 requiring the power.

Referring to FIG. 2, the insulation layer pattern 50 is disposed over the protective layer pattern 18 formed over the semiconductor chip 10. The insulation layer pattern 50 may be, for example, an organic layer including an organic matter.

The redistribution 60 is disposed over the insulation layer pattern 50. The redistribution 60 may have a single layer structure. The redistribution 60 may be, for example, a gold layer. Alternatively, the redistribution 60 may have a multiple layer structure. For example, the redistribution 60 may have one of a copper, nickel, and gold layer (Cu/Ni/Au); a copper and gold layer (Cu/Au); and a nickel and gold layer (Ni/Au).

The redistribution 60 may include a seed metal pattern 62. Examples of material that may be used as the seed metal pattern 62 include titanium, nickel, vanadium, and the like.

The redistribution 60 disposed over the insulation layer pattern 50 electrically connects at least two of: the power pad 24 included in the bonding pad group 20, the internal circuit pattern 30, and the additional power pad 40.

For example, the redistribution 60 may electrically connect the power pad 24 included in the bonding pad group 20 and the internal circuit pattern 30. At this time, ball land patterns (not shown) are disposed in the redistribution 60 electrically connected to the power pad 24 and the internal circuit pattern 30, and also to the additional power pad 40. Power is therefore independently provided to the redistribution 60 and the additional power pad 40. An organic layer pattern 86 is disposed over the insulation layer pattern 50 to cover the redistribution 60 and the organic layer pattern 86 has an opening that exposes each of the ball land pattern. A solder ball 90 is electrically connected to the ball land pattern through the opening of the organic layer pattern 86. The solder ball 90 attached to the ball land pattern is electrically connected to a printed circuit board (which provides the power).

Meanwhile, the redistribution 60 disposed over the insulation layer pattern 50 may electrically connect the power pad 24 included in the bonding pad group 20 and the additional power pad 40. At this time, ball land patterns (not shown) are disposed in the redistribution 60 electrically connected to the power pad 24 and the additional power pad 40, and also to the internal circuit pattern 30. Power is therefore independently provided to the redistribution 60 and the internal circuit pattern 30. A solder ball 90 may be attached to the ball land pattern to electrically connect a printed circuit board (which provides the power) to the ball land pattern.

Meanwhile, the redistribution 60 disposed over the insulation layer pattern 50 may be electrically connected to the additional power pad 40 and the internal circuit pattern 30. At this time, ball land patterns (not shown) are disposed in the redistribution 60 electrically connecting the additional power pad 40 and the internal circuit pattern 30, and also to the power pad 24 included in the bonding pad group 20. Power is therefore independently provided to the redistribution 60 and the power pad 24. A solder ball 90 may be attached to the ball land for electrically connecting a printed circuit board (which provides the power) to the ball land pattern.

Meanwhile, the redistribution 60 disposed over the insulation layer pattern 50 may be electrically connected to the power pad 24 included in the bonding pad group 20, the internal circuit pattern 30, and the additional power pad 40. At this time, ball land patterns (not shown) are disposed in the respective redistribution 60, and therefore power is provided to the redistribution 60. A solder ball 90 may be attached to the ball land pattern for electrically connecting a printed circuit board (which provides the power) to the ball land pattern.

The power is applied to the redistribution 60 electrically connected to the power pad 24, the internal circuit pattern 30, and the additional power pad 40. Power sufficient to drive the circuit part 15 can thus be provided to circuit part 15 in the body of the semiconductor chip 10.

Figure 3:
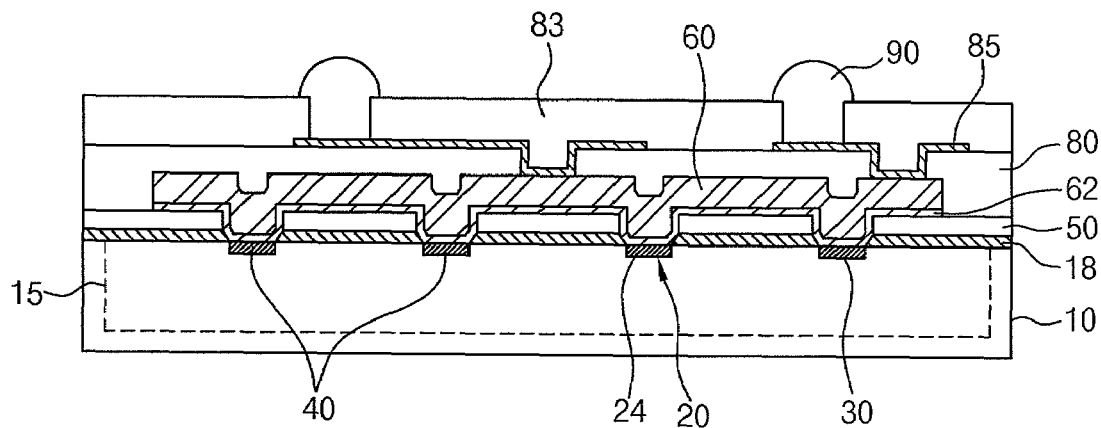
FIG. 3 is a sectional view showing a wafer level semiconductor package in accordance with another embodiment of the present invention.

FIG. 3 is a sectional view shown for illustrating a wafer level semiconductor package in accordance with another embodiment of the present invention.

Referring to FIG. 3, a semiconductor chip 10 may include a capping layer pattern 80, a ball land pattern 85, an organic layer pattern 83, and a solder ball 90.

The capping layer pattern 80 has an opening that exposes a portion of the redistribution 60 disposed over the insulation layer pattern 50. The ball land pattern 85 is disposed over the capping layer pattern 80 and the opening, and the ball land pattern 85 is electrically connected to the redistribution 60 through the opening. The organic layer pattern 83 is disposed over the ball land pattern 83 and the organic layer pattern 83 has an opening that exposes a portion of the ball land pattern 85. The solder ball 90 is electrically connected to the ball land pattern 85 through the opening of the organic layer pattern 83.

FIGS. 4 through 8 are a plan view and sectional views shown for illustrating the steps of a method for manufacturing a wafer level semiconductor package in accordance with an embodiment of the present invention.

Figure 4:
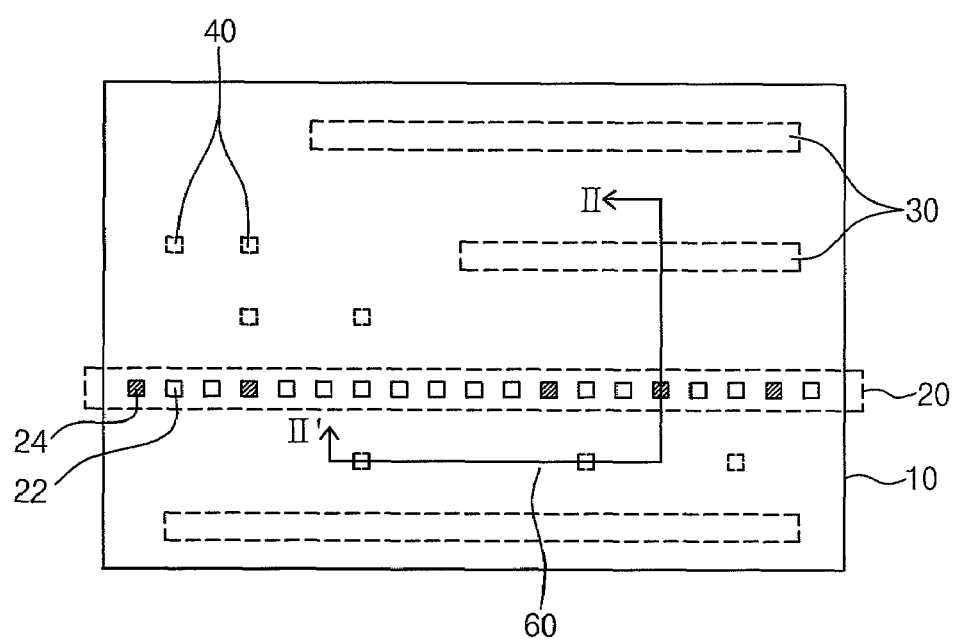
FIGS. 4 through 8 are a plan view and sectional views shown for illustrating the steps of a method for manufacturing a wafer level semiconductor package in accordance with an embodiment of the present invention.
Figure 5:
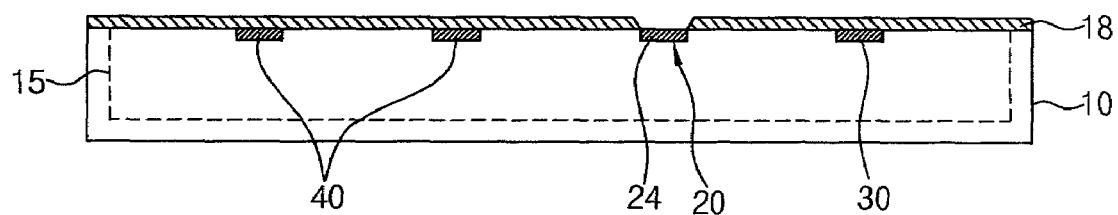

FIG. 4 is a plan view of a semiconductor chip in accordance with an embodiment of the present invention. FIG. 5 is a sectional view taken along a line II-II' in FIG. 4.

Referring to FIGS. 4 and 5, in order to manufacture a wafer level semiconductor package, a semiconductor chip 10 is first manufactured using a semiconductor device manufacturing process.

During the semiconductor device manufacturing process, the semiconductor chip 10 is formed with a circuit part 15, which includes a data storage part for storing data and a data processing part for processing the data. The semiconductor chip 10 is also formed with a bonding pad group 20 at an upper center surface thereof. The bonding pad group 20 includes a data pad 22, through which an address signal, a data signal, and a control signal is input or output, and a power pad 24, to which power for operating the semiconductor chip 10 is applied. Internal circuit patterns 30 electrically connected to the circuit part 15 are formed on both sides of the bonding pad group 20. Additional power pads 40 are also formed on both sides of the bonding pad group 20.

Additionally, a protective layer pattern 18 is formed over the upper surface of the semiconductor chip 10 during the semiconductor device manufacturing process. The protective layer pattern 18 may be an oxide layer and/or a nitride layer, and the protective layer pattern 18 includes openings selectively exposing the bonding pad group 20.

The semiconductor chip 10 (which is manufactured by the semiconductor device manufacturing process) includes a limited number of power pads 24, thus making it difficult to sufficiently provide power to the circuit part 15 in a semiconductor chip with an increased integration density of data and an increased data processing speed.

Figure 6:
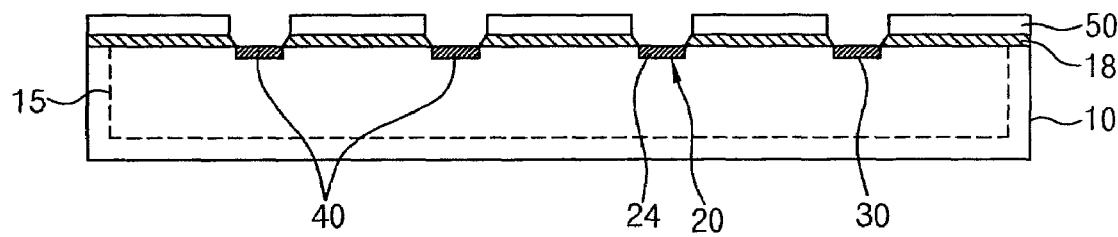

FIG. 6 is a sectional view shown for illustrating an insulation layer pattern being formed over the protective layer pattern shown in FIG. 5.

Referring to FIG. 6, in order to provide sufficient power to the circuit part 15, the protective layer pattern 18, which has the openings for exposing the data pad 22 and the power pad 24 included in the bonding pad group 20, is patterned again to expose the internal circuit patterns 30 and the additional power pads 40 to the outside. The internal circuit patterns 30 and the additional power pads 40 are electrically connected to the circuit part 15 respectively in order to provide sufficient power to the circuit part 15.

After the protective layer pattern 18 is patterned to expose the internal circuit patterns 30 and the additional power pads 40, an insulation layer (not shown) is formed over the protective layer pattern 18. The insulation layer may be, for example, an organic layer.

After the insulation layer is formed, a photoresist pattern is formed over the insulation layer using a photo process and a development process. The insulation layer is patterned using the photoresist pattern as an etching mask to form an insulation layer pattern 50 for exposing the internal circuit pattern 30, the additional power pad 40, and the bonding pad group 20.

Figure 7:
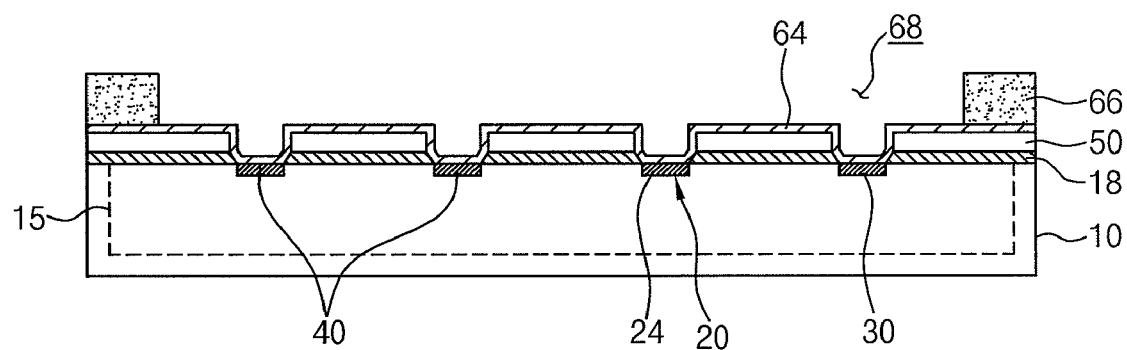

FIG. 7 is a sectional view shown for illustrating a seed metal layer being formed over the insulation layer pattern.

Referring to FIG. 7, after the insulation pattern 50 is formed, a seed metal layer 64 having a relatively thin thickness is formed over the insulation layer pattern 50. Examples of material that may be used as the seed metal pattern 62 include titanium, nickel, vanadium, and the like.

After the seed metal layer 64 is formed, a photoresist pattern 66 is formed over the seed metal layer 64. The photoresist pattern 66 includes an opening 68 for exposing a portion of the seed metal layer 64.

The opening 68 of the photoresist pattern 66 may have, for example, a linear shape extending in the area that connects the power pad 24 to the internal circuit pattern 30.

Additionally, opening 68 of the photoresist pattern 66 may have, for example, a linear shape extending in the area that connects the power pad 24 to the additional power pad 40.

Additionally, opening 68 of the photoresist pattern 66 may have, for example, a linear shape extending in the area that connects the additional power pad 40 to the internal circuit pattern 30.

Additionally, opening 68 of the photoresist pattern 66 may have, for example, a linear shape extending in the areas that connects the power pad 28, the additional power pad 40, and the internal circuit pattern 30.

Figure 8:
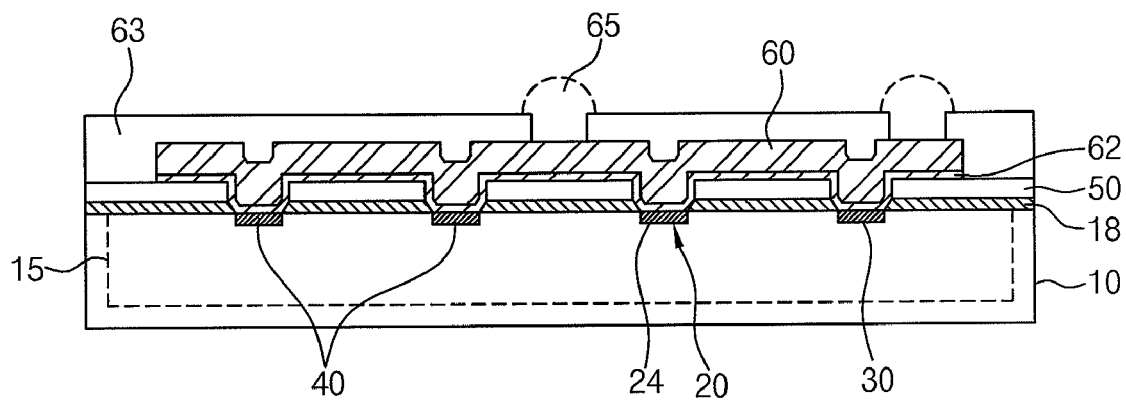

FIG. 8 is a sectional view shown for illustrating a redistribution in accordance with an embodiment of the present invention.

Referring to FIG. 8, after the photoresist pattern 66 having the opening 68 is formed over the seed metal layer 64, a plating process is carried out using the seed metal layer 64, and thus a redistribution 60 is formed over the seed metal layer 64.

In the present embodiment, the redistribution 60 may electrically connect the power pad 24 and the internal circuit pattern 30. Alternatively, the redistribution 60 may electrically connect the power pad 24 and the additional power pad 40. Alternatively, the redistribution 60 may electrically connect the additional power pad 40 and the internal circuit pattern 30. Alternatively, the redistribution 60 may electrically connect the power pad 24, the additional power pad 40, and the internal circuit pattern 30.

Meanwhile, when forming the redistribution 60, a ball land pattern (not shown) may be formed on the same plane as the redistribution 60. The power to be provided to the circuit part 15 is provided through the ball land pattern.

After the redistribution 60 is formed over the insulation layer pattern 50, the photoresist pattern 68 is removed from the seed metal layer 64, and the seed metal layer 64 is patterned using the redistribution 60 as an etching mask, and thus a seed metal pattern 62 below the redistribution 60 is formed.

After the redistribution 60 is formed over the insulation layer pattern 50, an organic layer pattern 63 having an opening that exposes the ball land pattern of the redistribution 60 is formed over the insulation layer pattern 50, and then a solder ball 65 may be electrically connected to the ball land pattern through the opening of the organic layer pattern 63.

In addition, as shown in FIG. 3, it is possible to form a capping layer pattern 80 exposing a portion of the redistribution 60. A ball land pattern 85 may be formed over the capping layer pattern 80, and then a solder ball may be attached to the ball land pattern 85.

As is apparent from the above description, the present invention has an advantage in that it satisfies a low voltage operation characteristic of a semiconductor chip, while providing sufficient power to the semiconductor chip. In turn, the present invention greatly enhances the performance of the semiconductor chip. Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A wafer level semiconductor package, comprising:
a semiconductor chip having a circuit part;
a bonding pad group disposed at the semiconductor chip, the bonding pad group including a power pad electrically connected to the circuit part, wherein the power pad provides power to the semiconductor chip;
an internal circuit pattern disposed in the semiconductor chip at a position outside of the position occupied by the bonding pad group and providing power to the circuit part;
an additional power pad disposed in the semiconductor chip at a position outside of the position occupied by the bonding pad group, the additional power pad being electrically connected to and providing power to the circuit part;
an insulation layer pattern disposed over the semiconductor chip, the insulation layer having openings exposing the power pad, the internal circuit pattern, and the additional power pad; and
a redistribution disposed over the insulation layer pattern and extending laterally so as to provide an electrical connection between at least two of the power pad, the internal circuit pattern, and the additional power pad.

2. The wafer level semiconductor package according to claim 1, wherein the wafer level semiconductor chip includes a plurality of the power pads, a plurality of the internal circuit patterns, and a plurality of the additional power pads.

3. The wafer level semiconductor package according to claim 1, wherein the bonding pad group is aligned and disposed in a center portion of the semiconductor chip and the internal circuit patterns and the additional power pads are respectively disposed at both sides of the bonding pad group.

4. The wafer level semiconductor package according to claim 1, wherein the redistribution extends to provide an electrical connection between the power pad and the internal circuit pattern.

5. The wafer level semiconductor package according to claim 1, wherein the redistribution extends to provide an electrical connection between the power pad and the additional power pad.

6. The wafer level semiconductor package according to claim 1, wherein the redistribution extends to provide an electrical connection between the additional power pad and the internal circuit pattern.

7. The wafer level semiconductor package according to claim 1, wherein the redistribution extends in areas of the semiconductor chip connecting the power pad, the additional power pad, and the internal circuit power so as to provide electrical connection between the power pad, the additional power pad, and the internal circuit pattern.

8. The wafer level semiconductor package according to claim 1, wherein the redistribution includes a ball land pattern and a solder ball attached to the ball land pattern.

9. The wafer level semiconductor package according to claim 1, further comprising a protective layer interposed between the semiconductor chip and the insulation layer, the protective layer including openings for exposing the bonding pad group, the internal circuit pattern, and the additional power pad.

10. The wafer level semiconductor package according to claim 1, further comprising:
a capping layer pattern disposed over the semiconductor chip, the capping layer pattern having an opening for exposing a portion of the redistribution;
a ball land pattern disposed over the capping layer pattern, wherein the ball land pattern is electrically connected to the redistribution through the opening; and
a solder ball attached to the ball land pattern.

11. The wafer level semiconductor package according to claim 1, wherein the redistribution includes at least one of a gold (Au) layer, copper, nickel and gold (Cu/Ni/Au) layer; a copper and gold (Cu/Au) layer; and nickel and gold (Ni/Au) layer.

12. A method for manufacturing a wafer level semiconductor package, comprising the steps of:
providing a semiconductor chip comprising:
a bonding pad group including a power pad that is electrically connected to a position of a circuit part;
an internal circuit pattern disposed at a position outside of the position occupied by the bonding pad group and providing power to the circuit part; and
an additional power pad disposed at a position outside of the position occupied by the bonding pad group, the additional power pad being electrically connected to and providing power to the circuit part;

forming an insulation layer over the semiconductor chip, the insulation layer having openings for exposing the additional power pad, the internal circuit pattern, and the bonding pad group; and forming a redistribution over the insulation layer and extending laterally so as to provide an electrical connection between at least two of the power pad, the internal circuit pattern, and the additional power pad.

13. The method for manufacturing a wafer level semiconductor package according to claim 12, wherein a protective layer pattern having an opening exposing the bonding pad group is provided over the semiconductor chip, and the protective layer pattern is patterned to expose the internal circuit pattern and the additional power pad.

14. The method for manufacturing a wafer level semiconductor package according to claim 12, wherein semiconductor chip includes a plurality of the additional power pads, and the additional power pads are disposed at both sides of the bonding pad group.

15. The method for manufacturing a wafer level semiconductor package according to claim 12, wherein the step of forming the redistribution includes the step of forming a ball land pattern disposed over the insulation layer and connected to the redistribution.

16. The method for manufacturing a wafer level semiconductor package according to claim 12, further comprising:

after the step of forming the redistribution, the steps of:

forming a capping layer covering the redistribution and having an opening for exposing a portion of the redistribution; and forming a ball land pattern over the capping layer such that the ball land pattern is electrically connected to the redistribution through the opening.

17. The wafer level semiconductor package according to claim 1, wherein the redistribution is configured to provide power to the at least two of the power pad, the internal circuit pattern, and the additional power pad to which it is electrically connected.

18. The wafer level semiconductor package according to claim 2, where in the wafer level semiconductor chip includes a plurality of redistributions each disposed over the insulation layer pattern and extending to electrically connect at least two of the power pad, the internal circuit pattern, and the additional power pad to each other, wherein each of the reclistributions provide power.

* * * * *